United States Patent
Mukherjee

(10) Patent No.: US 9,742,466 B2
(45) Date of Patent: Aug. 22, 2017

(54) MOSCAP-BASED CIRCUITRY FOR WIRELESS COMMUNICATION DEVICES, AND METHODS OF MAKING AND USING THE SAME

(71) Applicant: Somnath Mukherjee, Milpitas, CA (US)

(72) Inventor: Somnath Mukherjee, Milpitas, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 15/146,740

(22) Filed: May 4, 2016

(65) Prior Publication Data

US 2016/0329931 A1    Nov. 10, 2016

Related U.S. Application Data

(60) Provisional application No. 62/156,687, filed on May 4, 2015.

(51) Int. Cl.
*H04B 5/00* (2006.01)
*H04B 1/04* (2006.01)
(Continued)

(52) U.S. Cl.
CPC ............. *H04B 5/0012* (2013.01); *H04B 1/04* (2013.01); *H04B 1/16* (2013.01); *H01L 23/66* (2013.01);
(Continued)

(58) Field of Classification Search
CPC .......... H04B 5/0012; H04B 1/04; H04B 1/16; H01L 28/60; H01L 2924/19041; H01L 2924/19105
(Continued)

(56) References Cited

U.S. PATENT DOCUMENTS

| | | |
|---|---|---|
| 2010/0151808 A1 | 6/2010 | Toncich et al. |
| 2010/0219494 A1 | 9/2010 | Barnaby |
| 2012/0235847 A1 | 9/2012 | Viikari et al. |

OTHER PUBLICATIONS

International Search Report and Written Opinion; International Searching Authority/US dated Aug. 29, 2016; International Application No. PCT/US16/30842; 9 pages; International Searching Authority/Commissioner for Patents, Alexandra, Virginia.
(Continued)

*Primary Examiner* — Eugene Yun
(74) *Attorney, Agent, or Firm* — Andrew D. Fortney; Central California IP Group, P.C.

(57) ABSTRACT

A wireless (e.g., near field or RF) communication device, and methods of manufacturing and using the same are disclosed. The wireless communication device includes a receiver and/or transmitter, a substrate with an antenna thereon, an integrated circuit, and one or more continuity sensors. The antenna receives and/or backscatters a wireless signal. The integrated circuit processes the wireless signal and/or information therefrom, and/or generates the wireless signal and/or information therefor. The continuity sensor(s) are configured to sense or determine the presence of a chemical or substance in the package or container, and thus a continuity state of a package or container on which the communication device is placed or to which the communication device is fixed or adhered. The continuity sensor(s) are electrically connected to a set of terminals of the integrated circuit different from the set of terminals to which the antenna is electrically connected.

23 Claims, 8 Drawing Sheets

(51) Int. Cl.
  *H04B 1/16*  (2006.01)
  *H01L 23/66*  (2006.01)
  *H01L 29/94*  (2006.01)

(52) U.S. Cl.
  CPC ...... *H01L 29/94* (2013.01); *H01L 2223/6677* (2013.01); *H01L 2924/14* (2013.01); *H01L 2924/19041* (2013.01); *H01L 2924/19105* (2013.01)

(58) Field of Classification Search
  USPC ...................................................... 455/41.1
  See application file for complete search history.

(56) References Cited

OTHER PUBLICATIONS

Vincent Liu, et al.; Ambient Backscatter: Wireless Communication Out of Thin Air; 12 pgs; obtained from http://faculty.washington.edu.

MOSCAP-BASED CIRCUITRY FOR WIRELESS COMMUNICATION DEVICES, AND METHODS OF MAKING AND USING THE SAME

CROSS REFERENCE TO RELATED APPLICATION

This application claims the benefit of U.S. Provisional Patent Application No. 62/156,687, filed on May 4, 2015, which is incorporated herein by reference as if fully set forth herein.

FIELD OF THE INVENTION

The present invention generally relates to the field(s) of wireless (e.g., near field and radio frequency) communication. More specifically, embodiments of the present invention pertain to wireless tags and devices with a metal-oxide-semiconductor capacitor (MOSCAP)-based front end, and methods of manufacturing and using the same.

DISCUSSION OF THE BACKGROUND

The limited cut-off frequency of printed doped polysilicon (PDPS) transistors and other types or kinds of transistors may not allow their application to RFID tags operating at higher radio frequencies (e.g., at a UHF frequency). However, the implementation and use of PDPS and other transistors is well known, including for MOSCAP devices. Such transistors and MOSCAP devices are useful in many applications. There is a need, however, for a low-cost, reliable solution for modulating (e.g., encoding) information and detecting high-frequency wireless signals in an RFID or other wireless tag (e.g., operating at one or more UHF and/or RF frequencies).

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to non-linear capacitors, wireless (e.g., near field communication [NFC], radio frequency [RF and/or RFID], high frequency [HF] and ultra-high frequency [UHF]) devices including a non-linear capacitor, and methods of manufacturing and using such non-linear capacitors and wireless communication devices. For example, a non-linear MOSCAP device (e.g., a MOS transistor configured or wired as a capacitor) can be used to create a modulator and/or detector in an RFID or other wireless tag that can operate beyond the cut-off frequency of the corresponding transistor. The modulator and/or detector can replace or be added to the front-end of an RFID or other wireless tag (e.g., operating at one or more UHF frequencies). Thus, in one aspect, the present invention relates to a non-linear capacitor, comprising a first electrode, a dielectric layer in contact with the first electrode, and a second electrode spaced apart from the first electrode by the dielectric layer and first semiconducting (e.g., printed doped polysilicon) body.

In various embodiments, the second electrode may comprise a second semiconducting (e.g., printed doped polysilicon) body, and the dielectric layer may comprise a silicon oxide. For example, the dielectric layer may comprise silicon dioxide. In further embodiments, the second electrode is in contact with the dielectric layer, and the dielectric layer may have a substantially constant thickness. In one example, the non-linear capacitor comprises a metal-oxide-semiconductor (MOS) transistor, the first semiconducting body comprises source and drain regions of the MOS transistor that are electrically connected to each other, the second electrode comprises a gate of the MOS transistor, and the dielectric layer comprises a gate dielectric layer of the MOS transistor. The source and drain regions of the MOS transistor may comprise first and second heavily-doped regions in a first printed doped polysilicon body, and the MOS transistor may further comprise first and second metal electrodes respectively connected to the first and second heavily-doped regions and electrically connected to each other. Such a MOS transistor behaves as a voltage-dependent non-linear capacitor.

In some additional or alternative embodiments, the second electrode overlaps the first electrode, the first electrode has at least one dimension with a value greater than that of the second electrode such that at least one area of the first electrode is not covered by the second electrode, and/or the dielectric layer has at least one opening in the at least one area of the first electrode not covered by the second electrode. Furthermore, at least first and second areas of the first electrode (e.g., source and drain regions) may not be covered by the second electrode, the dielectric layer may have an opening in each of the first and second areas of the first electrode not covered by the second electrode (e.g., for contacts to the source and drain regions), and the non-linear capacitor may further comprise a contact in each of the openings in the dielectric layer. The non-linear capacitor may further comprise one or more metal wires electrically connecting the contacts in the openings in the dielectric layer to each other and/or to other electrical structures.

In further embodiments, the non-linear capacitor further comprises a substrate. The first electrode may be on the substrate, the dielectric layer may be on the first electrode, and the second electrode may be on the dielectric layer.

In another aspect, the present invention concerns a wireless device, comprising the present non-linear capacitor and an antenna. A first end or pole of the antenna is electrically connected to the first electrode of the non-linear capacitor, and a second end or pole of the antenna may be electrically connected to the second electrode of the non-linear capacitor. In some embodiments, the wireless communication device comprises a near field and/or radio frequency communication device. Thus, the wireless device may further comprise a receiver (e.g., a rectifier and/or demodulator) and/or a transmitter (e.g., a modulator), a substrate with the non-linear capacitor and/or antenna thereon, and/or an integrated circuit (which may be on the same or different substrate as the antenna and/or non-linear capacitor). The antenna is configured to receive (or absorb power from) a first wireless signal from an external device (e.g., a reader), and backscatter the first signal with a second signal encoded thereon or combined therewith. In some embodiments (e.g., having an oscillator capable of operating at the main carrier frequency), the antenna may transmit or broadcast a wireless signal (e.g., to the external device). The integrated circuit may process (i) the first wireless signal and/or information therefrom and/or (ii) generate the second wireless signal and/or information therefor.

In various embodiments, the wireless device may further comprise a power supply or ground potential that is electrically connected to one of the first and second electrodes of the non-linear capacitor, and/or a switch electrically connected to one of the first and second electrodes of the non-linear capacitor. In one embodiment, the switch may be electrically connected to the first electrode of the non-linear capacitor, and the ground potential may be electrically connected to the second electrode of the non-linear capacitor. Additionally or alternatively, the switch may have a first state when the wireless device receives a wireless signal, and a second state when the wireless device backscatters the wireless signal.

In some embodiments, the wireless device (e.g., the integrated circuit) further comprises a decoder and/or demodulator electrically multiplexed to the first electrode of the non-linear capacitor (e.g., when the wireless device receives a wireless signal), an encoder or signal generator electrically multiplexed to the non-linear capacitor (e.g., when the wireless device backscatters a wireless signal), a battery that supplies power to the decoder, the demodulator and/or the encoder/signal generator, an oscillator coupled to electrically functional circuitry in the wireless device, such as (i) the decoder and/or demodulator and/or (ii) the encoder/signal generator, a memory configured to store at least identification data or code, and/or (iii) a sensor configured to detect a state of the wireless device or an environmental parameter. The oscillator may comprise or be a free-running oscillator, an RC circuit or a ring oscillator.

In a further aspect, the present invention relates to a method of processing a wireless signal, comprising receiving the wireless signal at the present wireless device, and processing the wireless signal using the wireless device. In one example, the method comprises extracting or generating power from the wireless signal. Alternatively or additionally, the method of processing a wireless signal may further comprise electrically connecting a decoder and/or demodulator to the first electrode of the non-linear capacitor when the wireless device receives the wireless signal.

In an even further aspect, the present invention relates to a method of sending information on a wireless signal, comprising generating a low-frequency signal using the present wireless device, mixing the low-frequency signal with another signal having a higher frequency than the low-frequency signal using the non-linear capacitor, and backscattering (or, alternatively, transmitting or broadcasting) the mixed signal using the antenna. In at least one embodiment, the non-linear capacitor comprises a MOS transistor, and the higher-frequency signal has a frequency greater than the cut-off frequency of the MOS transistor. For example, the MOS transistor may have a gate, a gate dielectric layer, and a PDPS body comprising source/drain terminals and a channel. The low-frequency signal may have a frequency of y Hz, and the mixed signal may have a frequency of $x \pm n \cdot y$ Hz, where x is the higher frequency, n is an integer of 1 to 4 (e.g., 1), and $x \gg n \cdot y$. Alternatively or additionally, the method of generating a wireless signal may further comprise electrically connecting a signal generator (e.g., encoder) to the non-linear capacitor when the wireless device backscatters (or, alternatively, transmits or broadcasts) a wireless signal.

As a result, the present invention may expand the use and functionality of wireless devices such as near field communication and RF tags. The novel tags and devices enable communication of identification information and/or other information about the product in the container or package and/or its shipment and storage on a subcarrier (i.e., a second signal encoded in, modulated onto, or mixed with a main carrier signal). These and other advantages of the present invention will become readily apparent from the detailed description of various embodiments below.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components and materials have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

The advantages of the present invention will become readily apparent from the detailed description of various embodiments below.

An Exemplary MOSCAP Device

Figure 1:
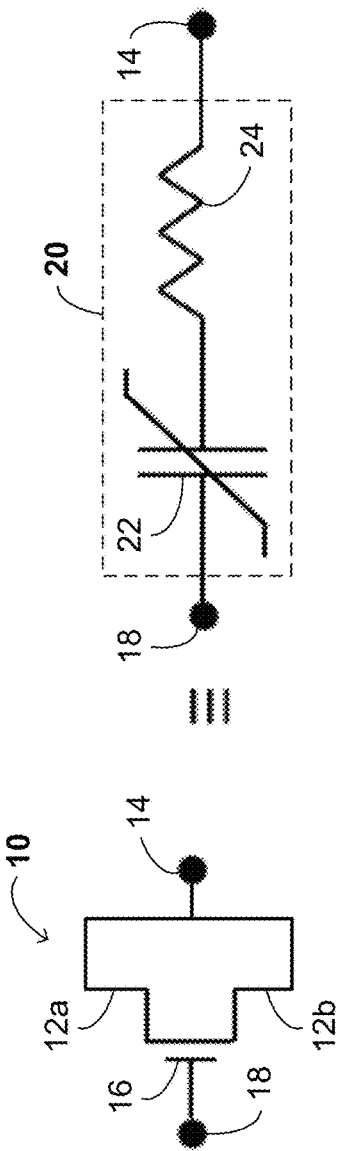
FIG. 1 is a diagram showing an exemplary MOSCAP device and an equivalent circuit in accordance with one or more embodiments of the present invention.

FIG. 1 shows a MOSCAP 10 and its equivalent circuit 20. MOSCAP 10 is a MOS transistor in which the source and drain terminals 12a-b are electrically connected to a common node 14, and the gate 16 is connected to a different node 18, thereby enabling the gate 16 and the (doped) silicon body in which the source and drain are formed to function as a non-linear capacitor. Thus, MOSCAP 10 can be considered to be equivalent to an RC circuit 20 including a non-linear capacitor 22 with a resistor 24 in series. In certain applications, the series resistance 24 can be considered negligible.

Figure 2:
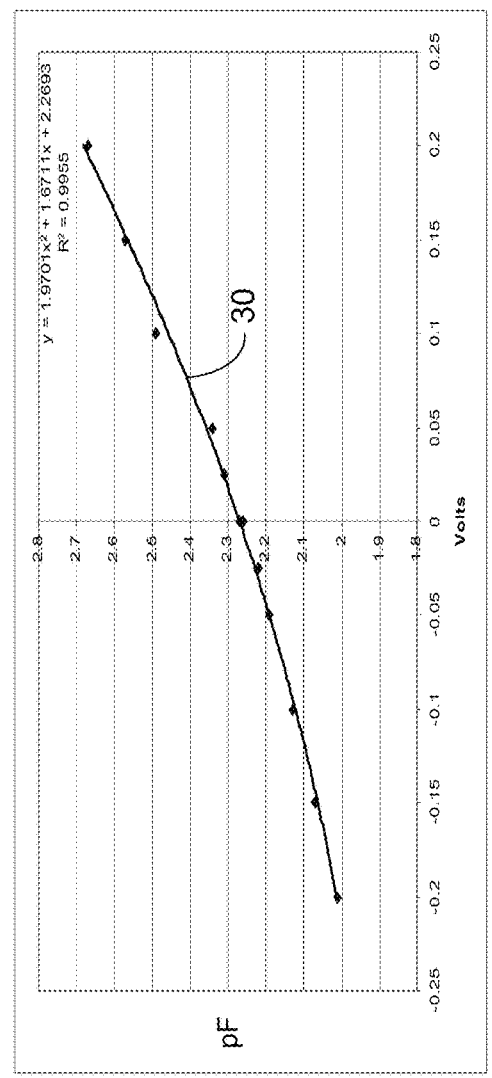
FIG. 2 is a graph showing a non-linear capacitance-voltage (C-V) curve of an exemplary MOSCAP.

A MOSCAP 10 formed from a printed doped silicon body and a printed doped polysilicon gate shows typical C-V characteristics similar to those shown in FIG. 2, which were determined experimentally for an exemplary, representative MOSCAP device. The C-V curve 30 was determined at 900 MHz. The MOSCAP 10 of FIG. 1 carries a displacement current, but does not carry a conduction current using charge carriers (electrons and holes), so it can operate at a frequency higher than the cut-off frequency of a corresponding transistor used to construct the MOSCAP 10 (i.e., the transistor 10 in FIG. 1 in which the source and drain terminals 12a-b are electrically connected to different nodes). In at least some cases, the C-V characteristics of the MOSCAP 10 are almost an order of magnitude higher than the cut-off frequency of the corresponding transistor.

Furthermore, MOSCAPs are inherently broadband devices. Therefore, the MOS CAP 10 is compatible with frequency-hopping techniques that are often employed with wireless tags and systems, such as UHF tags and readers, NFC tags/labels and readers, and RFID tags and readers.

The MOSCAP as a Detector

The non-linear capacitance of the MOSCAP 10 as a function of applied power or voltage enables use of the MOSCAP 10 as a detector to generate a DC signal from a received RF or other high-frequency signal. This function and/or property is useful for downstream (e.g., reader to tag) communications.

Figure 3:
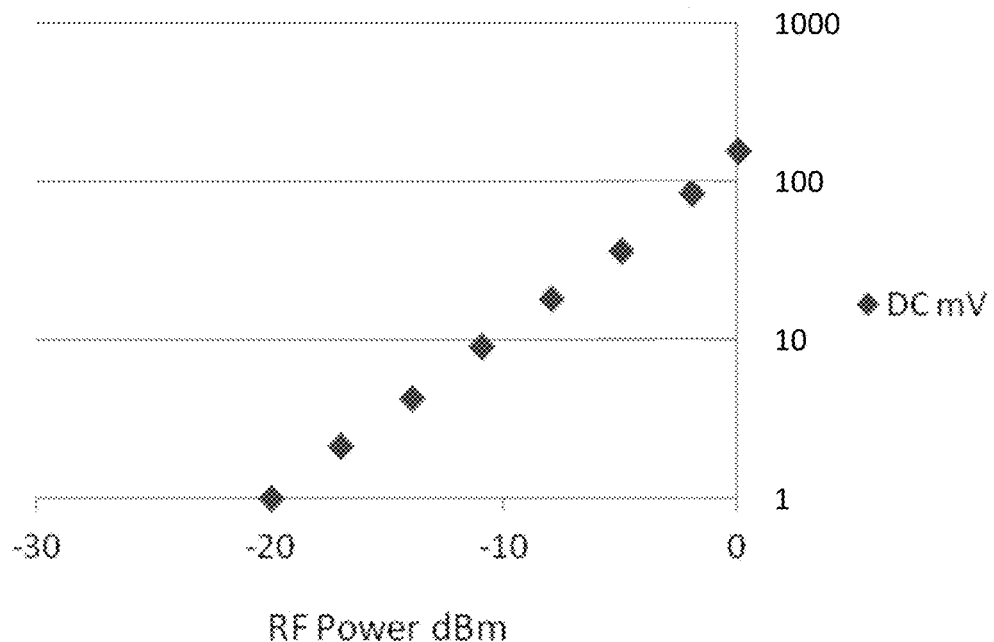
FIG. 3 is a graph showing the relationship between RF power of a received (input) signal and the DC voltage output by an exemplary MOSCAP in accordance with one or more embodiments of the present invention.

For example, FIG. 3 is a graph 40 that shows an experimentally determined DC voltage output by MOSCAP 10 as a function of RF power at 900 MHz. The logarithmic plot or line of DC voltage (in mV) as a function of RF power (in dBm) is linear or substantially linear. This indicates that the MOSCAP 10 can be used to receive commands and information from a reader that encodes or modulates such commands and information onto a high-frequency carrier signal.

The MOSCAP as a Mixer

The non-linear capacitance of the MOSCAP 10 also enables use of the MOSCAP 10 as or in a mixer to generate intermodulation components from two frequency sources (e.g., one RF frequency source and another frequency source at a lower frequency) in the same integrated circuit or on the same tag as the MOSCAP 10. This mixing property can be used for upstream communication (e.g., tag to reader) to generate a sub-carrier (e.g., a second signal at a different frequency), in addition to the RF signal. This sub-carrier can contain tag data such as identification code/information, product manufacturing and/or shipping information, sensor data, etc., in an appropriately coded form.

Figure 4:
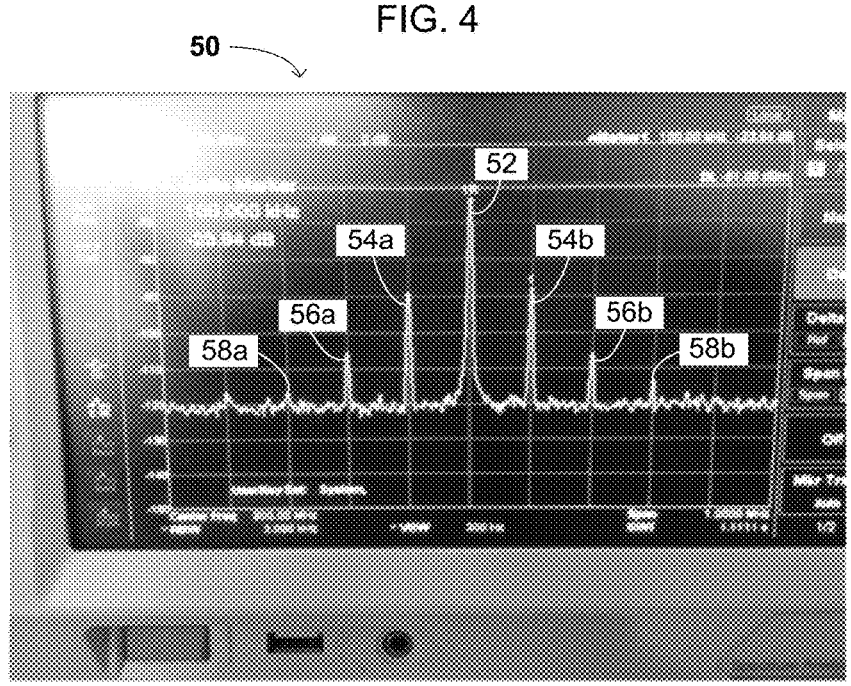
FIG. 4 shows the display of a spectrum analyzer displaying an exemplary mixed carrier signal generated using an exemplary RF tag with an exemplary MOSCAP thereon in accordance with one or more embodiments of the present invention.

FIG. 4 shows the spectral plot 50 of a 900 MHz carrier signal modulated by a 100 KHz sine wave. The 900 MHz carrier signal represented by peak 52 was produced by an RF signal generator input to a terminal or electrode of the MOSCAP 10, and the 100 KHz sine wave was input to the same terminal or electrode of the MOSCAP 10 as the 900 MHz carrier signal, resulting in generation of second-order components 54a-b, third order components 56a-b and fourth order components 58a-b. With further modification and/or optimization of parameters of the MOSCAP 10 and/or other circuitry on the tag, the third and fourth order components 56a-b and 58a-b can be enhanced or suppressed, as desired.

An Exemplary Wireless System and Device

Figure 5:
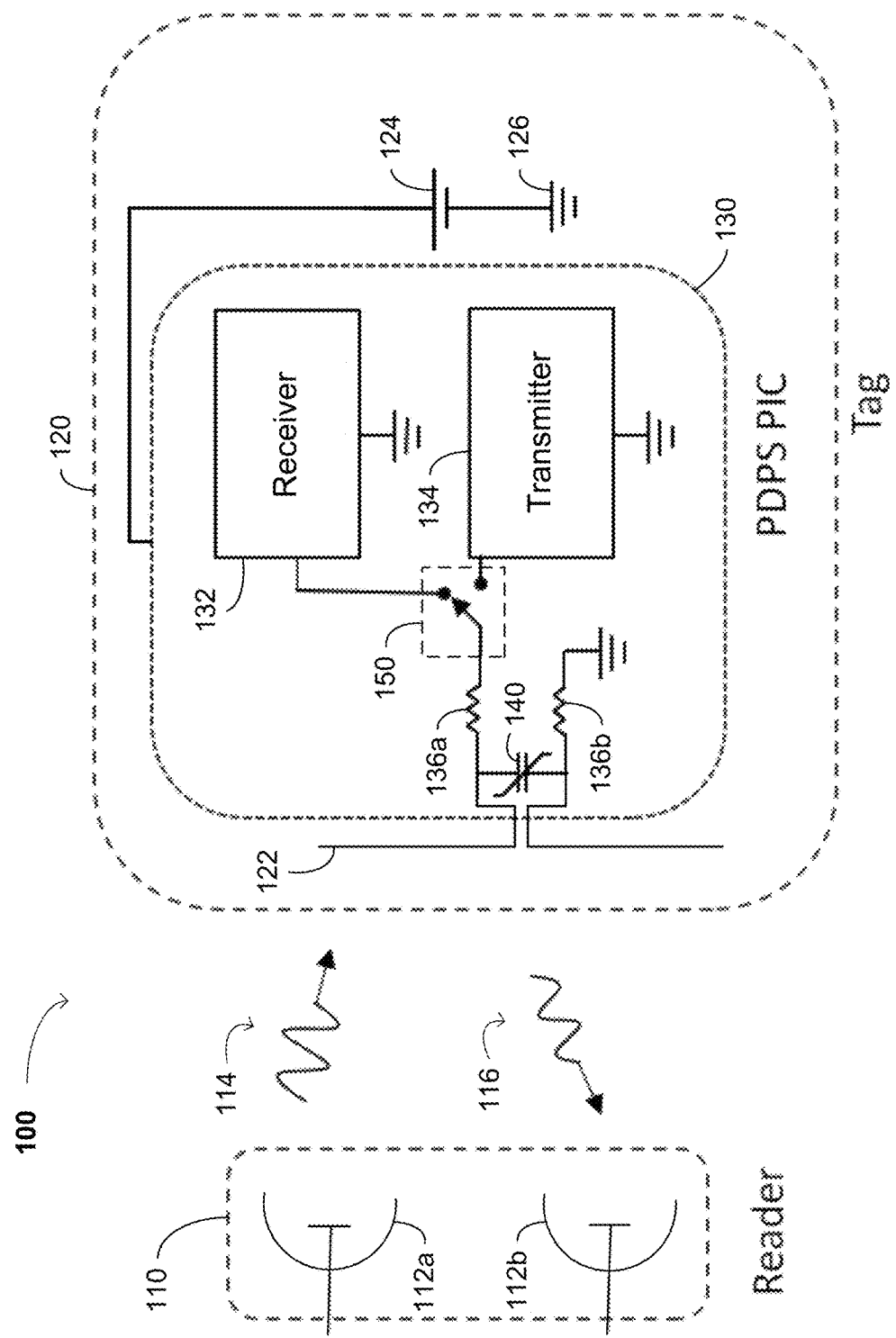
FIG. 5 is a schematic diagram showing an exemplary wireless system with a reader and an exemplary RF tag with an exemplary MOSCAP thereon in accordance with one or more embodiments of the present invention.

FIG. 5 shows a wireless system 100 comprising a reader 110 and a wireless tag 120. The reader 110 comprises transmit and receive antennas 112a-b, respectively transmitting a first wireless signal 114 and receiving a backscattered signal 116, modified by a data stream encoded thereon or combined therewith by the transmitter 134 and MOSCAP 140 in the tag 120. The tag 120 comprises an antenna 122, an integrated circuit 130, and a battery 124 coupled between the integrated circuit 130 and a ground potential 126. The antenna 122, integrated circuit 130, battery 124 and ground potential 126 (e.g., a ground plane) are generally formed on one or more substrates (not shown), which may be the same or different. For example, the integrated circuit 130 and the battery 124 may be formed on separate substrates, then placed on a third substrate on which the antenna 122 and ground plane 126 are formed using conventional or modified surface mount technology (SMT; e.g., pick-and-place) equipment.

In one embodiment, the tag 120 may be an RF device (e.g., an RFID tag). However, the tag 120 is not limited to an RF device or an RFID tag, and may be or comprise a near field communication (NFC) device (e.g., a tag or label), a high frequency (HF) device such as a toll tag, a very high frequency (VHF) or ultra-high frequency (UHF) device such as a smart card (e.g., a security card), etc. In various embodiments, the tag 120 may be formed on a substrate comprising a plate, disc and/or sheet of a glass, ceramic, dielectric and/or plastic. Alternatively, the substrate may comprise a flexible metal foil having a diffusion barrier layer thereon and an oxide layer or other electrical insulator on the diffusion barrier layer. The tag 120 may also be integrated or interfaced with one or more sensors (not shown).

A typical front-end of a battery-assisted RFID tag 120 using a MOSCAP 140 is shown in FIG. 5. The MOSCAP 140 is shown schematically as a non-linear capacitor. It is connected across the terminals of a dipole antenna 122, although other types of antennas (such as a coil, spiral or serpentine antenna) are also possible. In one embodiment, one pole (or, alternatively, one end) of the antenna is electrically connected to the gate of the MOSCAP 140, and the other pole (or, alternatively, other end) of the antenna is electrically connected to the source and drain terminals of the MOSCAP 140. The MOSCAP 140 is followed by a T-R switch 150 that operates at a relatively low frequency. Other types of switches may be employed in place of the T-R switch 150. A series resistance 136a is between one terminal of the MOSCAP 140 and the T-R switch 150, and another series resistance 136b (which may be the same as or different from the series resistance 136a) is between the other terminal of the MOSCAP 140 and ground. The MOSCAP 140 is implementable with a process capable of forming printed doped polysilicon structures (e.g., such as silicon islands, polysilicon gates, etc.). The tag 120 is illuminated (e.g., activated, or in embodiments without a battery, powered) by the signal 114 from the reader 110. In one embodiment, the signal 114 is an RF signal.

The T-R switch 150 selects between a receiver block 132 and a transmitter block 134. The receiver block 132 is configured to receive and process information from the wireless signal 114. In one example, the receiver 132 decodes a detected and/or recovered voltage (e.g., from the MOSCAP 140). The transmitter block 134 is configured to prepare, package, generate and/or encode data and/or other information for transmission to the reader 110 via the backscattered signal 116. In one example, the transmitter 134 generates and/or encodes data on a subcarrier signal (e.g., for mixing by the MOSCAP 140 and backscattering/transmission from the antenna 122).

The reader 110 typically encodes a command in a standard format (e.g., double sideband [DSB], single sideband [SSB], or phase reversal [PR], with or without amplitude shift keying [ASK]) and transmits the command via the wireless signal 114 to the tag 120. In one example, the command is encoded according to an EPC Global Class 1 Gen 2 standard. When the tag 120 receives the command via the wireless signal 114, it enters or is in a receive mode.

Figure 6:
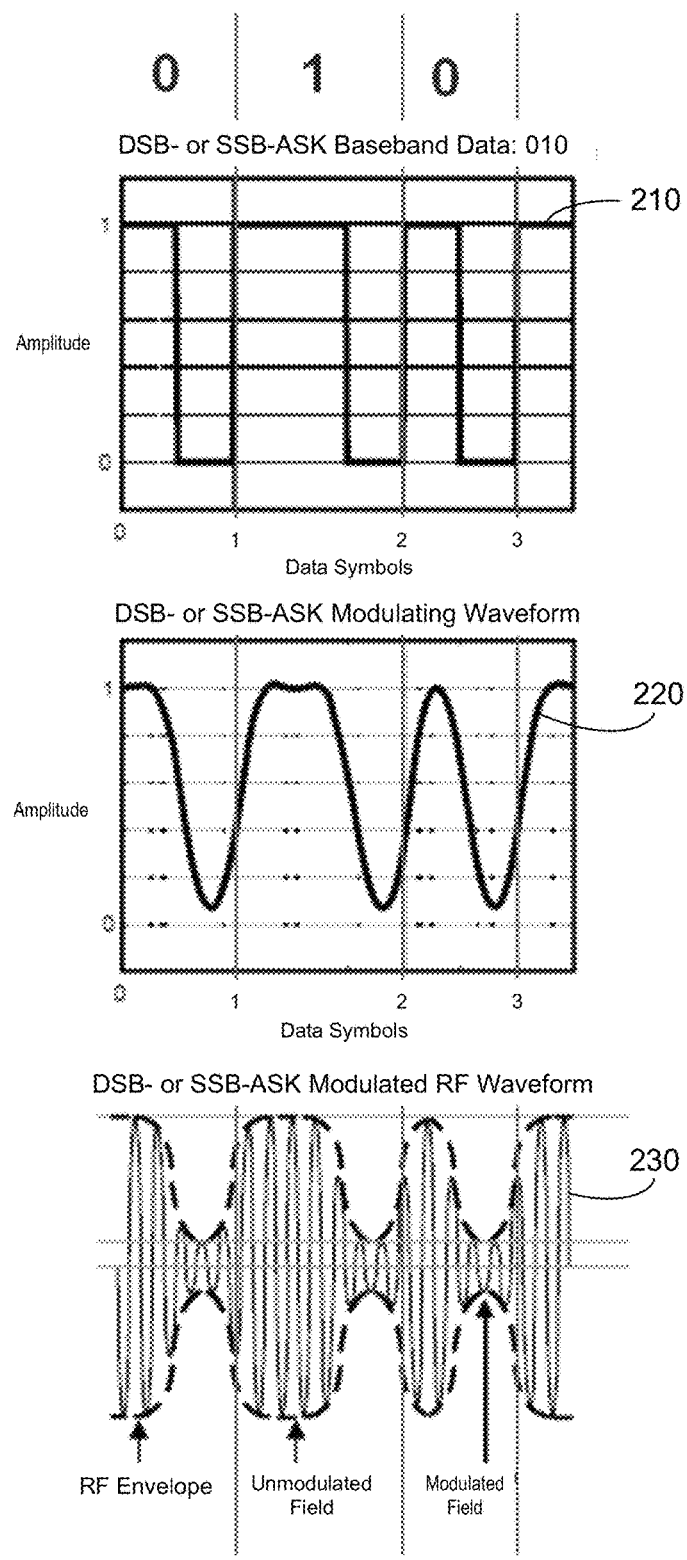
FIG. 6 shows exemplary waveforms in accordance with known encoding and/or modulating standards.

FIG. 6 shows typical ASK waveforms generated by the reader 110. For example, waveform 210 represents a DSB- or SSB-ASK baseband data signal having a value of "010," waveform 220 represents a DSB- or SSB-ASK modulated signal having the same value, and waveform 230 represents a DSB- or SSB-ASK modulated RF signal having the same value as waveform 220. In the modulated RF signal 230, the dashed lines represent the RF envelope, the large amplitude portions of the signal represent the unmodulated field, and the small amplitude portions of the signal represent the modulated field. The modulation depth of the waveforms 210-230 is between 80 and 100%. Due to the detection property of the MOSCAP 140, the envelope of the ASK waveform can be recovered and the command subsequently decoded by the receiver 132.

When the tag 120 transitions to a backscatter mode, the T-R switch 150 moves to the other position, connecting the transmitter 134 with the MOSCAP 140 and the antenna 122. A subcarrier (e.g., the Backscatter Link Frequency, or BLF) signal from the transmitter 134 is modulated (or mixed with the received main carrier signal) by the MOSCAP 140. The subcarrier signal may contain, for example, symbols in a standard format (e.g., an FM0 or MMS format). The BLF signal does not require frequency stability comparable to a crystal, and therefore, a free-running oscillator such as a PDPS MOSCAP 140 can be used to modulate the BLF signal.

The RF signal 114 from the reader 110 incident at the tag antenna 122 and the subcarrier undergo mixing at the MOSCAP 140 and generate sum/difference frequencies (e.g., first order harmonics, second order harmonics, etc.). These intermodulation signals are re-radiated by the tag antenna 122 as signal 116 and are eventually received by the antenna 112b in reader 110. It is possible to operate the reader 110 with one antenna instead of two antennas as in FIG. 5 (i.e., the same antenna may be used for transmit and receive operations in the reader 110).

Figure 7A:
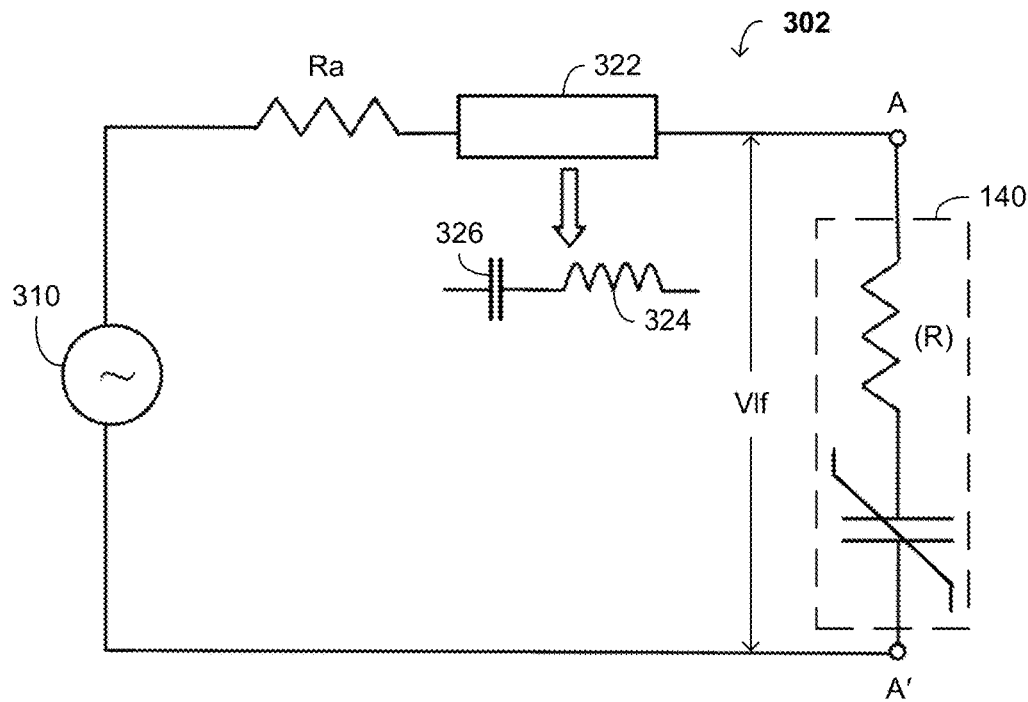
FIGS. 7A-B are schematic diagrams showing circuits equivalent to the exemplary RF tag of FIG. 5 in receive and transmit modes, respectively.
Figure 7B:
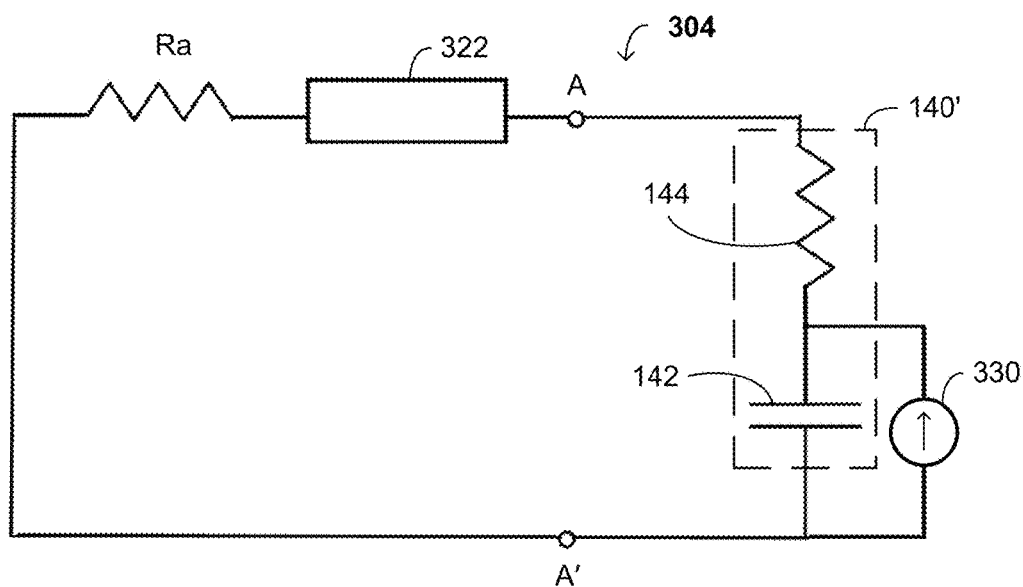

The mixing/modulation mechanism can be better understood by referring to the equivalent circuits 302 and 304 in FIGS. 7A and 7B, respectively. FIG. 7A shows the equivalent circuit 302 of the tag (e.g., tag 120 in FIG. 5) in the receive mode (applicable both for detection of downstream signals as well as receiving in mixing/backscatter mode). Referring back to FIG. 7A, a first resistance Ra represents the sum of the radiation resistance of the tag antenna 122 (FIG. 5) and losses of the tag antenna 122. The circuit element 322 may comprise a capacitance 326 and an inductance 324 in series that represents the reactance in the antenna 122 (FIG. 5). The circuit element 322 provides a reactance X(f) to make it resonant with the nominal capacitance of the MOSCAP 140, as the antenna 122 may be off-resonance. The voltage Vlf is the voltage across the MOSCAP 140.

FIG. 7B shows the equivalent circuit 304 of the tag in the backscatter/transmit mode (e.g., where the switch 150 in the tag 120 of FIG. 5 connects the MOSCAP 140 to the transmitter 134). Referring back to FIG. 7B, the first resistance Ra and the circuit element 322 are the same as in FIG. 7A. However, the MOSCAP 140' is modeled as a linear capacitor 142 in series with a resistance 144, with a current source 330 across the linear capacitor 142.

In backscatter/transmit mode (FIG. 7B), the non-linear current source 330 replaces the non-linear part of the MOSCAP 140, and the equivalent circuit 304 can be analyzed by linear technique(s). Determining the power dissipated across Rr (the radiation resistance of the tag antenna 122 in FIG. 5) gives the power radiated by the sum/difference signal(s).

To detect the tag (e.g., tag 120 in FIG. 5), a high frequency (e.g., RF or UHF) signal ($\omega_1=2\pi f_1$) and a low frequency (LF) signal ($\omega_2=2\pi f_2$) are coupled to the tag, and sum/difference frequencies ($\omega_1\pm\omega2$) are observed. The LF signal is coupled electrically (mainly through one or more traces from the transmitter 134 to the MOSCAP 140, e.g., at A and/or A' in FIG. 7A), whereas the high frequency signal is electromagnetically coupled through the antenna 122 (FIG. 5, and by equivalence, circuit element 322 in FIG. 7A).

The transmitter in the reader/deactivator 110 (FIG. 5) delivers a power $P_1$ to an antenna 112a with gain $G_1$ and produces a power density S (in W/m$^2$) at a distance r from the reader 110. This power density illuminates the tag 120 (FIG. 5)/equivalent circuit 302 (FIG. 7).

The detection operation can be approximated as a far-field condition. For far-field operation, $S=P_1\cdot G_1/4\pi r^2$. This can be simplified to the expression:

$$S=P_1\cdot\Theta \quad [1]$$

where $\Theta$ is a constant (in m$^{-2}$). One can also assume or approximate that S is constant over the extent or area of the tag. The available power $P_2$ at the tag antenna 122 (FIG. 5) is:

$$P_2=S\cdot\lambda^2 G_{tag}/4\pi \quad [2]$$

where $\lambda$ is the wavelength of the RF signal, and $G_{tag}$ is the gain of tag antenna 122 at the high frequency ($\omega_1$). As a result, one may create a lumped equivalent circuit 302 for the tag antenna (e.g., for an RF tag) in receive mode as shown in FIG. 7A. The equivalent circuit 302 is not applicable to tags with all types of antennas, but is valid for tags with dipole-like antennas without parasitic elements.

The RMS open circuit voltage generated at the tag antenna is given by $$Vrf=2\cdot\sqrt{P2\cdot Rr} \quad [3]$$

where Rr is the radiation resistance of the tag antenna 122. From Equations [1], [2] and [3], one can derive the following Equation [4]:

$$Vrf = 2\lambda \cdot \sqrt{\frac{Pi \cdot \Theta \cdot Gtag \cdot Rr}{4\pi}} \quad [4]$$

In the equivalent circuit model 302 of FIG. 7A, ohmic losses (e.g., incorporating skin effect) and dielectric losses that may be present in the tag antenna 122 (FIG. 5) may be included in the equivalent circuit 302 to create a composite resistance Ra=Rr+Rl. The tag antenna 122 has a natural resonant frequency exhibiting series resonance. Therefore, the reactance jX(f) of the circuit element 322 (FIGS. 7A-B) can be represented as a series L-C circuit (i.e., comprising inductor 324 and capacitor 326, in series with each other and with resistance Ra). Thus, the reactance of the circuit element 322 may be defined as follows:

$$X(f) = \omega \cdot La - \frac{1}{\omega \cdot Ca} \quad [5a]$$

For equivalent circuit 302, the antenna 122 (FIG. 5) is operated above the natural resonant frequency determined by circuit element 322 (FIG. 7A), making the reactance X(f) positive. This inductive reactance resonates with the capacitance in the MOSCAP 140. The resonant frequency of the tag (e.g., tag 120, FIG. 5) is therefore always higher than that of the tag antenna 122 alone.

If the bandwidth of operation is not too large, we can define an effective inductance La', which is an approximation, but one that is useful for understanding the operation of the equivalent circuit 302:

$$La' = X(f)/\omega \quad [5b]$$

The MOSCAP 140 is modeled as a series R-C circuit where the effective series resistance (R) is assumed to be linear (also an approximation in this case). The capacitance C of the MOSCAP 140 is of course non-linear, to generate the mixing signal. A parallel R-C model for the MOSCAP 140 may also be a suitable description and/or model for the MOSCAP 140.

In receive mode (i.e., during downstream communication from reader 110 to tag 120), the voltage Vlf in the equivalent circuit 302 is a DC voltage modulated according to a certain modulation format (examples of which are shown in FIG. 6). This signal may be decoded by the receiver 132 in FIG. 5.

In mixing mode, the MOSCAP (140, 140') is fed by the low frequency (LF) signal Vlf developed across the MOSCAP (e.g., across A-A' in FIGS. 7A-B) by electrical coupling. The LF signal ($\omega_2 = 2\pi f_2$) is coupled electrically from the transmitter 134 (FIG. 5) through switch 150 to the MOSCAP 140, whereas the high frequency (e.g., RF or UHF) signal ($\omega_1 = 2\pi f_1$) is electromagnetically coupled through the antenna 122.

In mixing mode, the voltage Vlf can be visualized as a modulation on the bias of the MOSCAP 140. As a result of non-linear mixing in the MOS CAP 140, a sum/difference current is generated. To simplify the exercise, one may limit the order of the non-linearity to two (i.e., third-order and higher order terms are not included). This mixing current can be represented by the current source 330 in FIG. 7B.

The mixing current in transmit mode (e.g., 330) enables determination of the power dissipated across radiation resistance Rr, and therefore, the radiated power $P_{mix}$ for the mixing signal $\omega 1 + \omega 2$. From such determinations, it can be seen that the mixing signal increases very strongly (fourth power) with reduction of zero-bias capacitance, increases as a square of normalized capacitance slope (C1/C0), and decreases very strongly (fourth power) with increase of losses in MOSCAP device 140.

Experimental Verification

Figure 8:
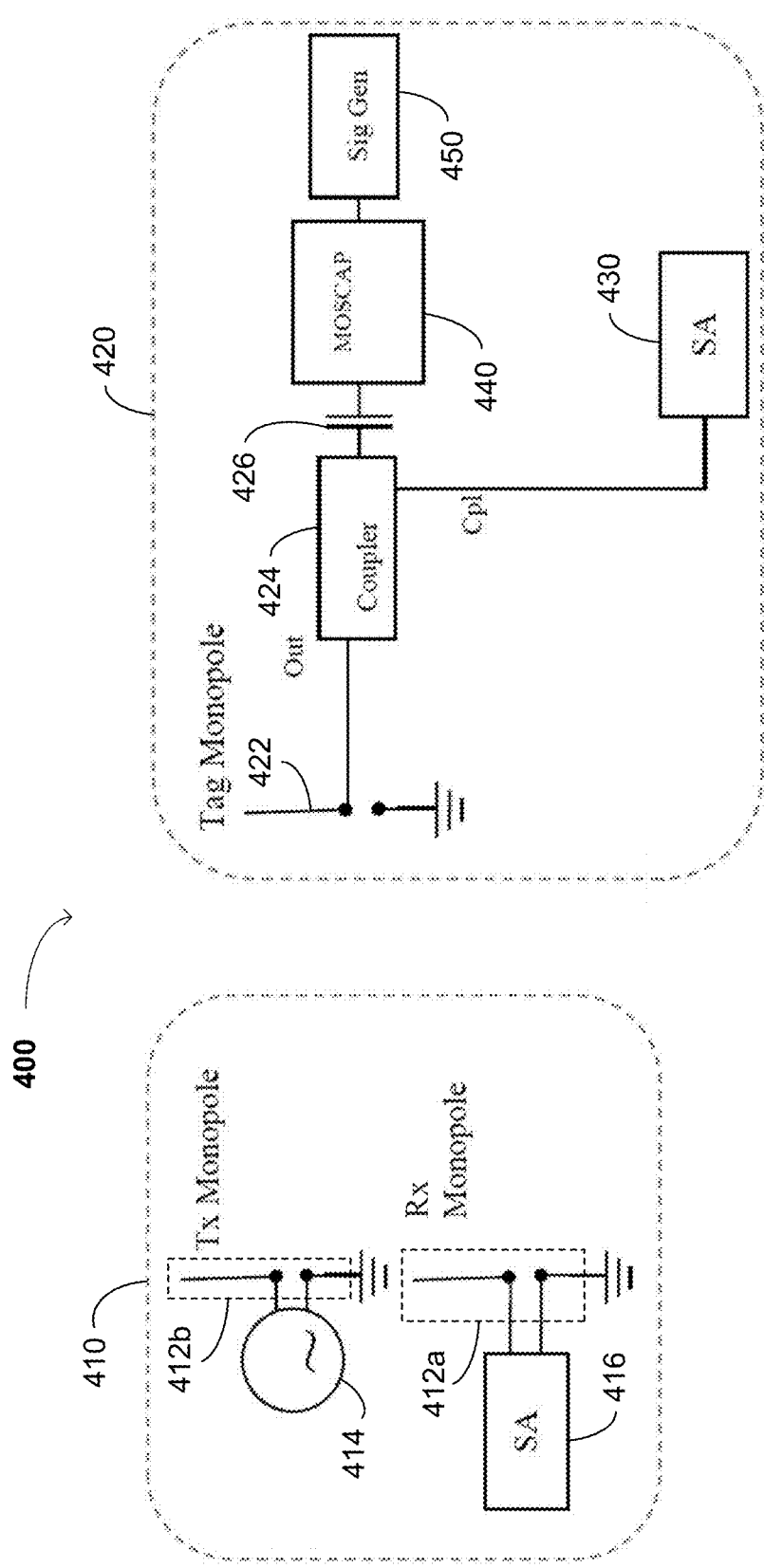
FIG. 8 is a schematic diagram showing an exemplary alternative wireless system with a reader and an exemplary RF tag with a MOSCAP device thereon, used to demonstrate feasibility of the present invention.

FIG. 8 shows an experimental system 400 representing the present invention. The system 400 includes a reader 410 and a wireless tag 420. The reader 410 includes a receiver antenna (monopole) 412a and a transmitter antenna (monopole) 412b. The transmitter antenna 412a is connected to an RF source 414 that outputs a signal having a power range of −10 to 30 dBm (e.g., 0-20 dBm, and in one example, about 10 dBm) at a frequency of from 1 MHz to 10 GHz (e.g., from 10 MHz-1 GHz, and in one example, about 900 MHz). The receiver antenna 412b is connected to a spectrum analyzer (SA) 416 to monitor the backscattered RF signal at the antenna 412a.

The tag 420 includes an antenna (monopole) 422, a coupler 424, a DC blocking capacitor 426, a spectrum analyzer (SA) 430, the MOSCAP 440, and a signal generator 450. For this experiment, the signal generator 450 generates a periodic signal at a frequency of 250 KHz, with a peak voltage of 500 mV and at an offset of −250 mV. In practice, however, other signals (e.g., data, identification, acknowledgement, etc.) can be generated at any frequency substantially below the frequency of the RF carrier transmitted from the reader transmitter antenna 412b. For example, the signal generator 450 may comprise a signal generator or modulator that generates a waveform representing data and/or an identification code, at a frequency of 0.1-10% of the frequency of the main carrier (e.g., 1-10,000 KHz).

The tag antenna 422 receives the RF signal radiated by the reader transmitter antenna 412b that passes through the coupler 424 and the DC blocking capacitor 426 before reaching the MOSCAP 440. The MOSCAP 440 modulates the RF signal with the signal from the signal generator 450. In this experiment, the combined signal from the coupler 424 was output through a cable (not shown) onto the antenna 422, but in practice, the cable is not present.

Figure 9:
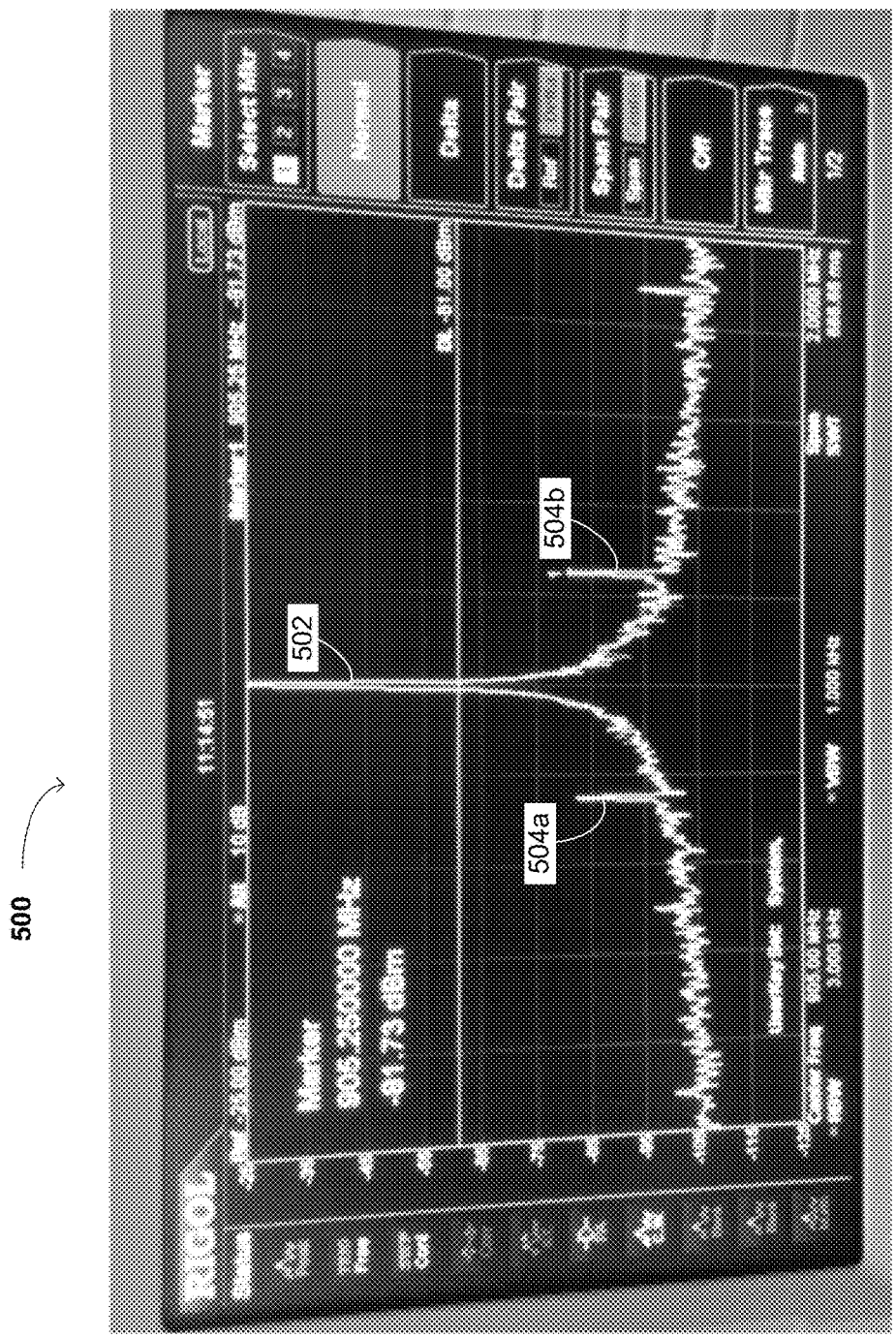
FIG. 9 shows the display of a spectrum analyzer displaying a combined (mixed carrier) signal received at the reader of FIG. 8 from the exemplary tag of FIG. 8.

FIG. 9 is a display 500 of a spectrum analyzer showing the combined signal received at the receiver antenna 412a in the reader 410 from the tag 420. The main carrier is shown by the center peak 502 at 905 MHz. The subcarrier signal from the tag 420 is shown in the first-order peaks 504a-b at 904.75 MHz and 905.25 MHz, respectively. Thus, the tag 420 including a MOSCAP 440 effectively backscatters or transmits a mixed (or frequency converted) signal (i.e., a signal comprising a main carrier at a first frequency and a first power, and a sub-carrier at a second frequency and a second power substantially different from the first frequency and the first power, respectively), making encoding and transmission of a second signal onto a main signal from a wireless tag feasible.

To emulate downstream operations (e.g., transmission of a signal from the reader 410 to the tag 420), the signal generator 450 was replaced by a voltmeter. A detected voltage of ~2 to 3 mV was observed in the detected signal.

An Exemplary Integrated Circuit

In various embodiments, the present wireless device includes an integrated circuit. In some embodiments, the integrated circuit comprises a receiver, a transmitter, and a memory. The wireless device may be or comprise a near field and/or radio frequency communication device, and may comprise the transmitter, the receiver, the memory, and an optional power extraction circuit (e.g., a rectifier) coupled to the antenna and configured to extract a DC voltage from a received wireless signal. The transmitter may comprise a signal generator (e.g., encoder) or modulator, and the receiver may comprise a demodulator or decoder.

Figure 10:
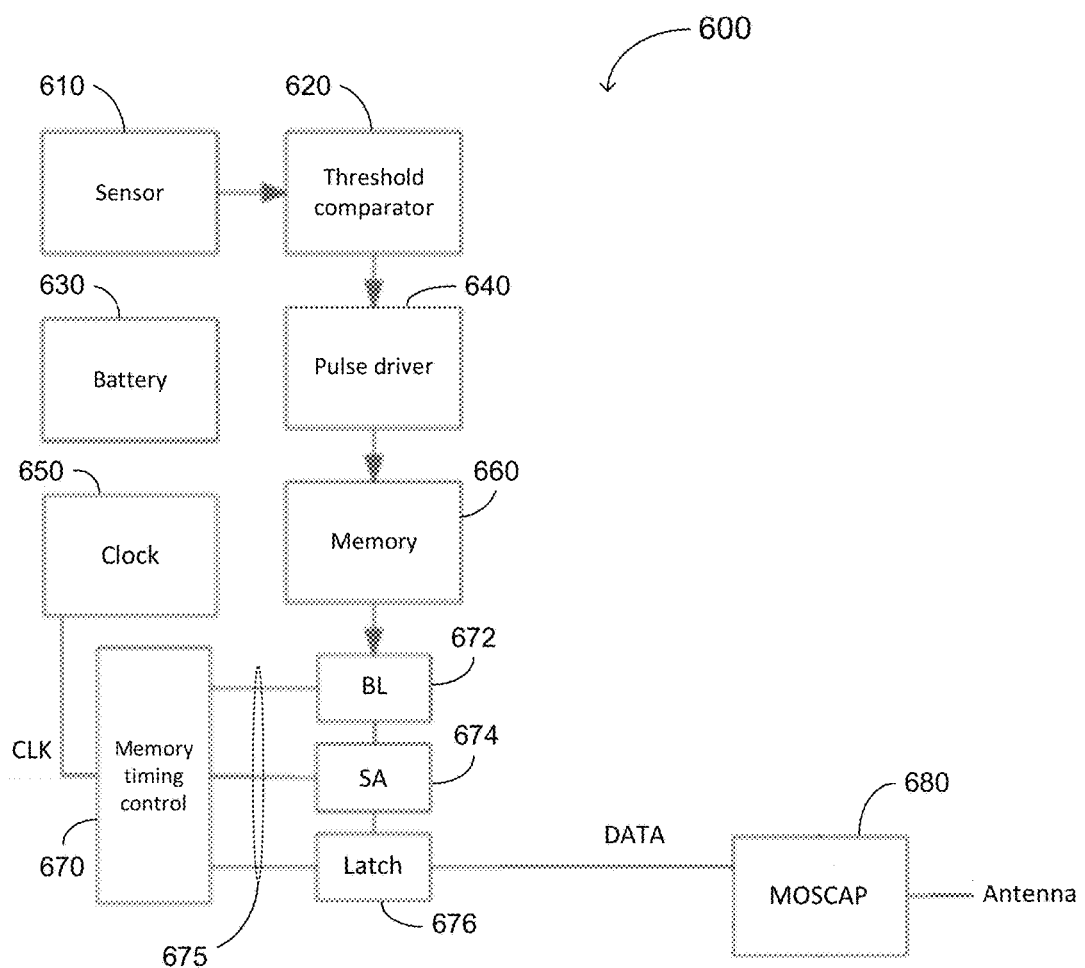
FIG. 10 is a block diagram showing an exemplary integrated circuit for use in the present wireless device.

FIG. 10 shows an exemplary IC 600 suitable for use in the present wireless device, which may include one or more sensors 610, a threshold comparator 620 receiving information (e.g., a signal) from the sensor 610, a pulse driver 640 receiving an output of the threshold comparator 620, a memory 660 that may store sensor data from the pulse driver 640, one or more bit lines (BL) 672 for reading data from the memory 660, one or more sense amplifiers (SA) 674 for converting signal on the bit line(s) to digital signals, one or more latches 676 for temporarily storing data from the sense amplifier(s) 674, and the MOSCAP 680 configured to output data (including identification code) from the wireless device via an antenna. The exemplary IC 600 in FIG. 10 also contains a clock circuit 650 configured to provide a timing signal (e.g., CLK) that controls the timing of certain operations in the IC 600 and a memory timing control block or circuit 670 that controls the timing of memory read operations. The MOSCAP 680 may be or comprise the MOSCAP 140 in FIG. 5, for example, and may function as a transmitter (e.g., a modulator) and receiver/detector (e.g., a demodulator). The exemplary IC 600 may also include a rectifier that provides a direct current signal (e.g., VCC) to various circuits and/or circuit blocks in the IC 600 when a battery or other a power supply block or circuit is not present on the tag. The memory 660 may also contain identification code. The portion of the memory 660 containing identification code may be printed.

The IC 600 may further contain one or more tuning or storage capacitors, etc. One or more terminals in the MOSCAP 680 are connected to an antenna (e.g., the antenna 122 in FIG. 5). In one example, the gate of the MOSCAP 680 may be coupled to one end or pole of the antenna, and the source and drain terminals of the MOSCAP 680 may be coupled to the other end or pole of the antenna.

In various embodiments, the battery (not shown in FIG. 10) may comprise a conventional thin-film or printed battery, comprising a first current collector layer, a cathode, an electrolyte layer, an anode, and a second current collector layer. In general, the cathode is in electrical contact (and generally is in physical contact) with one of the first and second current collector layers, and the anode is in electrical contact (and generally is in physical contact) with the other of the first and second current collector layers. The electrolyte layer is between the cathode and the anode, and is generally in electrical and physical contact with each of the cathode and the anode. The battery (e.g., battery 124 in FIG. 5) may be placed or formed on the tag substrate or a separate substrate and electrically connected to the integrated circuit 600 (FIG. 10).

The memory 660 in the NFC and/or RFID tag 600 may contain a fixed number of bits. In various embodiments, the memory 660 includes a plurality of bits configured to store a unique identification code for the wireless device (or for the container or package on which the wireless device is placed or adhered). In some examples, the memory 660 further includes one or more bits configured to store a value corresponding to an output of the sensor 610. One or more layers of the memory 660 may be formed by printing. At least part of the memory 660 that includes the plurality of bits configured to store the unique identification code may be formed by printing.

In some implementations, the memory 660 in the integrated circuit (IC) 600 may contain $m*2^n$ bits, where m is a positive integer and n is an integer of at least 3 (e.g., 24, 32, 48, 64, 128, 256 or more bits). Some bits are allocated to overhead (non-payload) data for format identification and data integrity (CRC) checking. The payload of the device 600 consumes the remainder of the bits. For example, the payload can be up to $(m-p)*2^n$ bits, where p is a positive integer <m (e.g., 96 bits in the case where $m*2^n=128$ bits and up to 224 bits in the case where $m*2^n=256$ bits).

The payload of the IC 600 can be allocated to variable amounts of fixed ROM bits (which are generally—but not always—used as a unique identification number). When print methods are used in manufacturing the integrated circuit 600, the ROM bits are permanently encoded and cannot be electrically modified. Any payload bits that are not allocated as fixed ROM bits can be allocated as dynamic sensor bits. These sensor bits can change values, based on a sensed input. Different splits or allocations between ROM and sensor bits are indicated by data format bits that are part of the non-payload or "overhead" bits, generally in the first $2^n$ bits (or $2^{n-q}$ bits, where q is a positive integer <n, such as 16 bits in the case where $m*2^n=128$ or 256) of the memory 660.

The IC 600 may include one or more sensors 610. For example, the IC 600 can include one or more temperature sensors, humidity sensors (e.g., to test the humidity level of the package environment), continuity sensors, electromagnetic field sensors, current/voltage/power sensors, light sensors, or chemical sensors (e.g., for oxygen, carbon monoxide, carbon dioxide, nitrogen oxides, sulfur dioxide and/or trioxide, ozone, one or more toxins, etc.). The present IC 600 may also include one or more time sensors (e.g., configured to count or determine elapsed time), including the clock circuit 650 (which can be a basis for a real-time clock) and/or one or more counters, dividers, etc., receiving a clock signal from the clock circuit 650, as is known in the art.

In some examples, the IC 600 may have more than one memory 660, one in which the identification number and/or other payload bits are stored, and another to store data from one or more sensors, information about a product on which the wireless device is placed or adhered, etc. A second bit line, sense amp and latch may process information from the second memory, and a second memory timing control circuit (or alternative output[s] from the memory timing control circuit 670) may output the information from the second latch at a frequency/rate and power that allows or enables the MOSCAP 680 to output such information on the sub-carrier. In such an example, the identification number and/or payload information is output on the main carrier.

Parts of the integrated circuit 600 other than the memory 660 may also be printed. Thus, the integrated circuit 600 may comprise one or more printed layers (e.g., a plurality of printed layers) and/or one or more thin films (e.g., a plurality of thin films). For example, the integrated circuit 600 may comprise one or more thin films and one or more printed layers. Alternatively, the integrated circuit 600 may be or comprise an "all-printed" integrated circuit.

The antenna can also be printed (e.g., using printed conductors such as, but not limited to, silver from a silver paste or ink) or manufactured using conventional methods like etched aluminum (e.g., by sputtering or evaporating aluminum on a substrate such as a plastic film or sheet, patterning by low-resolution [e.g., 10-1,000 μm line width] photolithography, and wet or dry etching). The antenna can be sized and shaped to match any of multiple form factors, and in one example, to preserve compatibility with the 13.56 MHz target frequency of the NFC reader hardware.

The integrated circuit 600 can be used in all RFID tags (not just HF, NFC and/or 13.56 MHz tags), including RFID tags operating at frequencies higher or lower than 13.56 MHz (e.g., in the high frequency [HF] range [3-30 kHz], very high frequency [VHF] range [30-300 kHz], and ultra high frequency [UHF] range [300-3000 kHz]), especially in the case where the RFID tag has the ability or functionality to accept input(s) from an internal sensor 610 or an external sensor, and communicate the data from the sensor when read by an RFID reader adapted to read such a tag.

Exemplary Methods of Making a Wireless Communication Device and a Non-Linear Capacitor The present invention also concerns a method of manufacturing a wireless communication device, comprising forming an antenna on a substrate, forming a non-linear capacitor (e.g., a MOSCAP) in electrical communication with the antenna, forming an integrated circuit (IC) on a common or different substrate, and electrically connecting the antenna and the non-linear capacitor to the IC. The non-linear capacitor may be part of the IC or separate from the IC. In examples in which the non-linear capacitor is or comprises a MOSCAP, a gate electrode of the MOSCAP is electrically connected to a first end or pole of the antenna, and source and drain electrodes of the MOSCAP are electrically connected to a second end or pole of the antenna. In some embodiments, the IC, the antenna and the non-linear capacitor are formed on a common substrate (i.e., the same substrate). Alternatively, the IC may be formed on a different substrate from the substrate on which the antenna and the non-linear capacitor are formed (i.e., a second substrate, when the antenna and the non-linear capacitor are formed on the same [e.g., first] substrate). The antenna is configured to receive and/or backscatter wireless signals.

Forming the non-linear capacitor may comprise forming a first electrode of the non-linear capacitor on a substrate, forming a dielectric layer in contact with the first electrode, and forming a second electrode of the non-linear capacitor spaced apart from the first electrode by the dielectric layer. The first electrode comprises a semiconducting body, and the second electrode comprises a conductor or semiconductor. The non-linear capacitor may carry a displacement current, but does not carry a conduction current. At least one of the first and second non-linear capacitor electrodes may comprise a printed doped polysilicon body. For example, each of the first and second electrodes may comprise a printed doped polysilicon body (i.e., the first electrode comprises a first printed doped polysilicon body, and the second electrode comprises a second printed doped polysilicon body). In examples in which the non-linear capacitor is or comprises a MOSCAP, the MOSCAP may comprise a single MOSCAP or a plurality or array of MOSCAPs in parallel and/or in series.

In addition, one or both of the first and second MOSCAP electrodes may be printed. For example, one or more layers of the MOSCAP may be printed using a doped or undoped silicon ink in a pattern corresponding to a structure in the MOSCAP (e.g., a gate, an island or body in which the source and drain are formed, etc.). The ink may comprise a silicon source or precursor (e.g., a cyclosilane and/or polysilane), a dopant source or precursor, and a solvent in which the silicon and dopant sources or precursors are soluble. Alternatively, the method may further comprise implanting or diffusing a first dopant into the first silicon body, and when the second silicon body is present, implanting or diffusing a second dopant into the second silicon body. In a further alternative, the method may further comprise printing a doped dielectric onto at least one of the first and second silicon bodies, and diffusing a dopant from the doped dielectric into the underlying silicon body or bodies.

The method may further comprise forming a dielectric layer on the first electrode of the MOSCAP, prior to forming the second electrode of the MOSCAP. The dielectric layer may be formed by blanket deposition (e.g., chemical vapor deposition), selective deposition (e.g., printing or extrusion coating), or thermal growth/oxidation of the underlying first electrode. For example, the dielectric layer may comprise a silicon oxide, such as silicon dioxide, and may have a substantially constant thickness. In some embodiments, the second electrode of the MOSCAP is in contact with the dielectric layer.

In some embodiments, the second electrode overlaps the first electrode, the first electrode has at least one dimension with a value greater than that of the second electrode such that at least one area of the first electrode is not covered by the second electrode, and the dielectric layer has at least one opening in the at least one area of the first electrode not covered by the second electrode. In examples in which the non-linear capacitor is or comprises a MOSCAP, at least first and second areas of the first electrode are not covered by the second electrode, the dielectric layer has an opening in each of the first and second areas of the first electrode not covered by the second electrode, and the non-linear capacitor further comprises a contact in each of the openings in the dielectric layer. When forming the dielectric layer comprises blanket depositing, printing or growing the dielectric layer on the first electrode, the method may further comprise forming the opening(s) in the dielectric layer.

In further embodiments, the method further comprises forming one or more (e.g., a plurality of) metal wires electrically connecting the contacts in the openings in the dielectric layer. Forming the metal wires may comprise, for example, printing a metal-containing ink in a pattern corresponding to the wires.

Similarly, forming the integrated circuit may comprise printing one or more layers of the integrated circuit. For example, the method may comprise printing a plurality of the layers of the integrated circuit. Alternatively or additionally, forming the integrated circuit may comprise forming a plurality of layers of the integrated circuit by one or more thin film processing techniques. In some examples, forming the integrated circuit may comprise forming one or more layers of the integrated circuit by one or more thin film processing techniques, and printing one or more additional layers of the integrated circuit. In other examples, one or more layers of the integrated circuit that can be made from the same material as a layer of the MOSCAP can be formed at the same time as the layer of the MOSCAP. For example, islands or bodies of transistors in the IC can be formed at the same time as the island or body of the MOSCAP, and gates of transistors in the IC can be formed at the same time as the gate of the MOSCAP.

In some embodiments, forming the antenna consists of forming a single metal layer on the substrate, and etching the single metal layer to form the antenna. Alternatively, forming the antenna may comprise printing a metal ink on the substrate in a pattern corresponding to the shape of the antenna. In such embodiments, the IC (if formed on a separate, electrically insulating or isolated substrate) can be formed or made in a manner enabling the IC to function as a bridge or strap over coils or loops of the antenna to electrically connect the terminals of the antenna to the IC. This allows for use of an antenna that consists of a single patterned metal layer.

Printing offers advantages over photolithographic patterning processes, such as low equipment costs, greater throughput, reduced waste (and thus, a "greener" manufacturing process), etc., which can be ideal for relatively low transistor-count devices such as near field, RF and HF tags. Thus, in some cases, the method may comprise printing a plurality of the layers of the MOSCAP and the integrated circuit. Printing various layers (and in one example, all of the layers) of the wireless device facilitates integration of the method into existing high-speed, high-throughput manufacturing processes, such as roll-to-roll processing. Alternatively, thin film processing also has a relatively low cost of ownership, and is a relatively mature technology, which can result in reasonably reliable devices being manufactured on a wide variety of potential substrates. Thus, in some embodiments, the best of both approaches can be used, and the method may form one or more layers of the integrated circuit by one or more thin film processing techniques, and printing one or more additional layers of the integrated circuit.

In some embodiments, the method may further comprise electrically connecting one of the first and second electrodes of the non-linear capacitor to a power supply or ground potential (or to a power supply or ground potential pin), and/or forming a switch electrically connected to one of the first and second electrodes of the non-linear capacitor. Thus, in one embodiment, the switch is electrically connected to the first electrode of the non-linear capacitor, and the ground potential is electrically connected to the second electrode of the non-linear capacitor. Alternatively or additionally, the switch may have a first state when the wireless device receives a wireless signal, and the switch may have a second state when the wireless device backscatters the wireless signal.

An Exemplary Method of Using a Wireless Device to Identify a Package or Container and Obtain Information The present invention further concerns a method of using a wireless device that can backscatter a main carrier signal with information (such as identification and/or product information or sensor data) on a sub-carrier signal. Thus, the method of use may comprise identifying a package or container and/or obtaining product information and/or sensor data using the sub-carrier signal. The method may comprise comprising placing the wireless device on the package or container, and reading the main carrier and sub-carrier signals from the wireless device. In various embodiments, the wireless device comprises an antenna, a MOSCAP electrically connected to the antenna, and an integrated circuit electrically connected to each of the antenna and the MOSCAP. In some embodiments, the wireless device comprises a near field and/or radio frequency communication device, such as an NFC tag.

The invention also contemplates a package or container with the present wireless device thereon. The package or container may comprise a box, tray, bottle, jar, envelope, etc., and may have a cap, seal, lid, flap or other closing mechanism adhered to and/or mated with the box, tray, bottle, jar or envelope. The wireless device may be conventionally adhered onto or integrated into the package or container, or alternatively, placed within the package or container. The wireless device may be read by placing a reader in sufficient proximity to the wireless device to enable (i) the reader to transmit or broadcast a wireless signal to the wireless device, (ii) the wireless device to receive the wireless signal and backscatter the wireless signal (e.g., the main carrier) with the subcarrier signal modulated or encoded thereon, and (iii) the reader to receive the main carrier signal with the subcarrier signal modulated or encoded thereon from the wireless device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A non-linear capacitor, comprising:
a) a first electrode, comprising a printed doped polysilicon body having source and drain terminals electrically connected to a common node;
b) a dielectric layer in contact with the first electrode, and
c) a second electrode spaced apart from the first electrode by the dielectric layer, comprising a printed doped polysilicon gate;
wherein said capacitor is configured to generate intermodulation components from (i) a main carrier signal from a first source at a first frequency of from 1 MHz to 10 GHz and a first power and (ii) a sub-carrier signal from a second source at a second frequency and a second power, the intermodulation components having different frequencies from the first frequency and substantially less power than the first power.

2. The non-linear capacitor of claim 1, wherein the dielectric layer comprises a silicon oxide.

3. The non-linear capacitor of claim 1, wherein the dielectric layer has a substantially constant thickness.

4. The non-linear capacitor of claim 1, further comprising a substrate, wherein the first electrode is on the substrate, the dielectric layer is on the first electrode, and the second electrode is on the dielectric layer.

5. A wireless device, comprising:
a) the non-linear capacitor of claim 1; and
b) an antenna, wherein a first end, pole or terminal of the antenna is electrically connected to the first electrode of the non-linear capacitor, and a second end, pole or terminal of the antenna is electrically connected to the second electrode of the non-linear capacitor.

6. The wireless device of claim 5, further comprising a receiver electrically connected to the non-linear capacitor when the wireless device receives a wireless signal, and a transmitter or signal generator electrically connected to the non-linear capacitor when the wireless device backscatters a wireless signal.

7. The wireless device of claim 6, further comprising a battery that supplies power to the receiver and the transmitter or signal generator.

8. The wireless device of claim 5, further comprising a switch electrically connected to one of the first and second electrodes of the non-linear capacitor.

9. The wireless device of claim 8, further comprising a power supply or ground potential, electrically connected to the other one of the first and second electrodes of the non-linear capacitor.

10. The wireless device of claim 8, wherein the switch has a first state when the wireless device receives a wireless signal, and the switch has a second state when the wireless device backscatters a wireless signal.

11. The wireless device of claim 10, further comprising a decoder and/or demodulator electrically connected to the non-linear capacitor when the wireless device receives a wireless signal, and an encoder or signal generator electrically connected to the non-linear capacitor when the wireless device backscatters a wireless signal.

12. The wireless device of claim 5, further comprising an oscillator coupled to electrically functional circuitry in the wireless device.

13. The wireless device of claim 5, further comprising a memory configured to store at least identification data or code.

14. The wireless device of claim 5, further comprising a sensor configured to detect a state of the wireless device or an environmental parameter.

15. A method of processing a wireless signal, comprising:
a) receiving the wireless signal at the wireless device of claim 5; and
b) processing the wireless signal using the wireless device.

16. A method of generating a wireless signal, comprising:
a) generating a modulated signal in the wireless device of claim 5; and
b) mixing the modulated signal with another signal having a higher frequency than the modulated signal using the non-linear capacitor; and
c) backscattering, transmitting or broadcasting the mixed, modulated signal using the antenna.

17. The method of claim 16, wherein the non-linear capacitor comprises a MOSCAP device, and the modulated signal has a frequency greater than a cut-off frequency of a transistor corresponding to the MOSCAP device.

18. The method of claim 16, wherein the modulated signal has a frequency of y Hz, and the mixed, modulated signal has a frequency of $x \pm n*y$ Hz, where x is a frequency of the other signal having the higher frequency, n is an integer of 1 or 2, and $x \gg n*y$.

19. The method of claim 16, further comprising electrically connecting a modulator configured to generate the modulated signal to the non-linear capacitor when the wireless device backscatters the mixed, modulated signal.

20. The non-linear capacitor of claim 1, wherein the first frequency is from 10 MHz-1 GHz.

21. The non-linear capacitor of claim 20, wherein the second frequency is from 1 KHz to <10,000 KHz.

22. The non-linear capacitor of claim 1, wherein the non-linear capacitor is configured to operate at a frequency higher than a cut-off frequency of an otherwise identical transistor in which the source and drain terminals are electrically connected to different nodes.

23. The non-linear capacitor of claim 1, wherein the non-linear capacitor carries a displacement current, but not a conduction current using charge carriers.

* * * * *